United States Patent [19]
Kazama

[11] Patent Number: 6,043,666
[45] Date of Patent: Mar. 28, 2000

[54] ELECTROCONDUCTIVE SPRING CONTACT UNIT

[75] Inventor: Toshio Kazama, Nagano, Japan

[73] Assignee: NHK Spring Co., Ltd., Kanagawa-Jen, Japan

[21] Appl. No.: 08/884,582

[22] Filed: Jun. 27, 1997

[30] Foreign Application Priority Data

Jun. 28, 1996 [JP] Japan ................................ 8-188199

[51] Int. Cl.[7] .............................. G01R 1/067; G01R 1/04; G01R 31/26
[52] U.S. Cl. ........................ 324/754; 324/757; 324/158.1
[58] Field of Search ................................ 324/754, 757, 324/158.1

[56] References Cited

U.S. PATENT DOCUMENTS

| | | | |
|---|---|---|---|
| 5,200,695 | 4/1993 | Kazama | 324/757 |
| 5,225,773 | 7/1993 | Richards | 324/754 |
| 5,461,326 | 10/1995 | Woith et al. | 324/758 |
| 5,865,632 | 2/1999 | Iwasaki | 324/754 |

FOREIGN PATENT DOCUMENTS 8-15171 2/1996 Japan.

*Primary Examiner*—Glenn W. Brown
*Attorney, Agent, or Firm*—Skjerven, Morrill MacPherson, Franklin & Friel; Alan H. MacPherson

[57] ABSTRACT

In an electroconductive contact unit including an electroconductive coil member received in an axial bore with the axial ends of the coil member projecting from the axial bore so as to serve as contact pin sections, the contact pin sections are formed by closely wound segments of the coil member while the middle part of the coil member is formed as a compression coil spring section for biasing the contact pin sections. The compression coil spring section includes a coarsely wound segment and a normally wound segment. When in use, the adjacent turns of the coil wire of at least the normally wound segment of the coil member are brought into contact with each other so that the coil member is made electrically equivalent to a cylinder in most part, and can thereby minimize its electric inductance and electric resistance.

24 Claims, 8 Drawing Sheets

ELECTROCONDUCTIVE SPRING CONTACT UNIT

CROSS REFERENCE TO RELATED PATENTS AND PATENT APPLICATIONS

The contents of the following patents and patent applications may be related to the invention of this application, and the contents of these patents and patent applications are incorporated in this application by reference.

PCT/JP97/01237 filed Apr. 10, 1997
PCT/JP96/03791 filed Dec. 25, 1996
U.S. Pat. No. 5,798,655 issued Aug. 25, 1998
U.S. Pat. No. 5,631,574 issued May 20, 1997
U.S. Pat. No. 5,414,369 issued May 9, 1995
U.S. Pat. No. 5,410,260 issued Apr. 25, 1995

TECHNICAL FILD

The present invention relates to an electroconductive unit which is suitable for use in contact probe units such as those used for open/short tests, environmental tests, burn-in tests and so forth of semiconductor devices and other electronic devices. The electroconductive unit of the present invention is also useful for use in sockets for semiconductor devices in the forms of bare chips, LGA, BGA, CSP and so forth, as well as in electric connectors.

BACKGROUND OF THE INVENTION

Various forms of contact units are used in contact probes for open/short tests, environmental tests and burn-in tests of semiconductor devices and printed circuit boards. The contact units are also used in sockets for semiconductor devices which may be in the forms of bare chips, LGA (and grid array), BGA (ball grid array), CSP (chip side package) and so forth. Electric connectors may also use such contact units.

Recently with the increase in the frequency of the signals that are required to be processed by semiconductor devices, it has become necessary for the contact units for the sockets of semiconductor devices and the contact probes for testing semiconductor devices to be able to handle high frequency signals of up to several hundred MHz. In particular, the contact units are required to have a lower electric inductance and resistance more than before.

Also, such electroconductive contact units are required to be compact in size so as to be arranged extremely close to each other, and to be provided with a sufficient resiliency so as to accommodate any irregularities in the surface states of the parts to be contacted. Japanese patent publication No. 8-15171 discloses the use of a coil member consisting of a compression coil spring having contact pin sections defined, at either axial end, by straight terminal sections of the coil wire of the compression coil spring. It also teaches that the terminal ends of the compression coil spring may be made relatively firm by reducing the coil diameter and/or reducing the coil pitch. However, because this conventional contact unit uses the compression coil spring as an internal conductor, the electric signal is conducted along a spiral path, and therefore encounters a substantial electric inductance. The electric resistance of the compression coil spring may also create a problem.

BRIEF SUMMARY OF THE INVENTION

In view of such problems of the prior art, a primary object of the present invention is to provide an electroconductive contact unit which is low in inductance and resistance.

A second object of the present invention is to provide an electroconductive contact unit which is compact in size.

A third object of the present invention is to provide an electroconductive contact unit which is provided with a sufficient resiliency to accommodate any irregularities in the surface states of the parts to be contacted.

According to the present invention, such objects can be accomplished by providing an electroconductive contact unit, comprising: a holder defining an axial bore, the axial bore including a small diameter section having a relatively small diameter at each axial end thereof; an electroconductive coil member received in the axial bore, the coil member including a pair of contact pin sections adapted to be brought into contact with an object to be contacted at either axial end thereof, and a compression coil spring section interposed between the contact pin sections, each of the contact pin sections having a free end which is smaller in diameter than the small diameter section of the axial bore, and the compression coil spring section including a part having a larger diameter than the small diameter section of the axial bore; wherein the compression coil spring section includes a coarsely wound segment and a normally wound segment.

When the contact unit is in use, and applied to an object to be contacted, the adjacent turns of the coil wire of the normally wound segment may be brought into contact with each other so that the electric signal is allowed to pass axially along the length of the coil member typically with the exception of the coarsely wound segment. Therefore, the coil member is electrically substantially equivalent to a cylinder, and can minimize its electric inductance and electric resistance. Alternatively, the adjacent turns of the coil wire of the normally wound segment may be brought into contact with each other when the coil member is assembled in the axial bore.

If desired, the configuration of the coil member may be selected such that the adjacent turns of the coil wire of the coarsely wound segment may be brought into contact with each other when the contact unit is in use. In this case, to the end of accommodating any irregularities in the height of the object to the contacted or the dimensions in the various parts of the contact unit, the coil member may further include a small diameter segment in a part adjacent to a boundary between one of the contact pin sections and the compression coil segment so that any excess or additional deflection of the coil member may be accommodated by the coil wire of the small diameter segment deflecting into an interior of an adjacent larger diameter segment of the coil member.

To form contact pin sections which are firm and stable, each of the contact pin sections may comprise a closely wound segment of the coil member. The closely wound segments may be each tapered toward a free end thereof, and/or may comprise a cylindrical segment having a substantially uniform diameter at a free end thereof.

So that a large number of contact units may be arranged extremely close to each other while ensuring a high positional accuracy of each contact unit and a low manufacturing cost, the axial bore may be defined by a pair of holes which are formed in at least a pair of plates in axial alignment with each other. To retain the coil member inside the axial bore without requiring any additional component parts, the axial bore may include a cylindrical middle section having a substantially uniform diameter, and a pair of tapered sections formed at either axial end of the middle section, and tapering off towards axial ends thereof. Alternatively, the axial bore may be defined by a pair of strictly tapered holes provided in at least two plates, the tapered holes being joined at large diameter ends thereof.

In order to minimize the electric inductance and resistance of the coil member while ensuring a favorable resiliency of the contact pin sections, the normally wound segment of the coil member may be provided with such a pitch that adjacent turns of a coil wire of the normally wound segment are brought into contact with each other when at least one of the contact pin sections is brought into contact with an object to be contacted.

Coarsely wound coil springs are known to be prone to entangling with each other when they are placed next to each, and this can cause a serious problem in feeding the component parts during the assembling process. To avoid such entangling of coil wires from occurring, the compression coil segment may further comprise a closely wound segment interposed between the normally wound segment and the coarsely wound segment.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
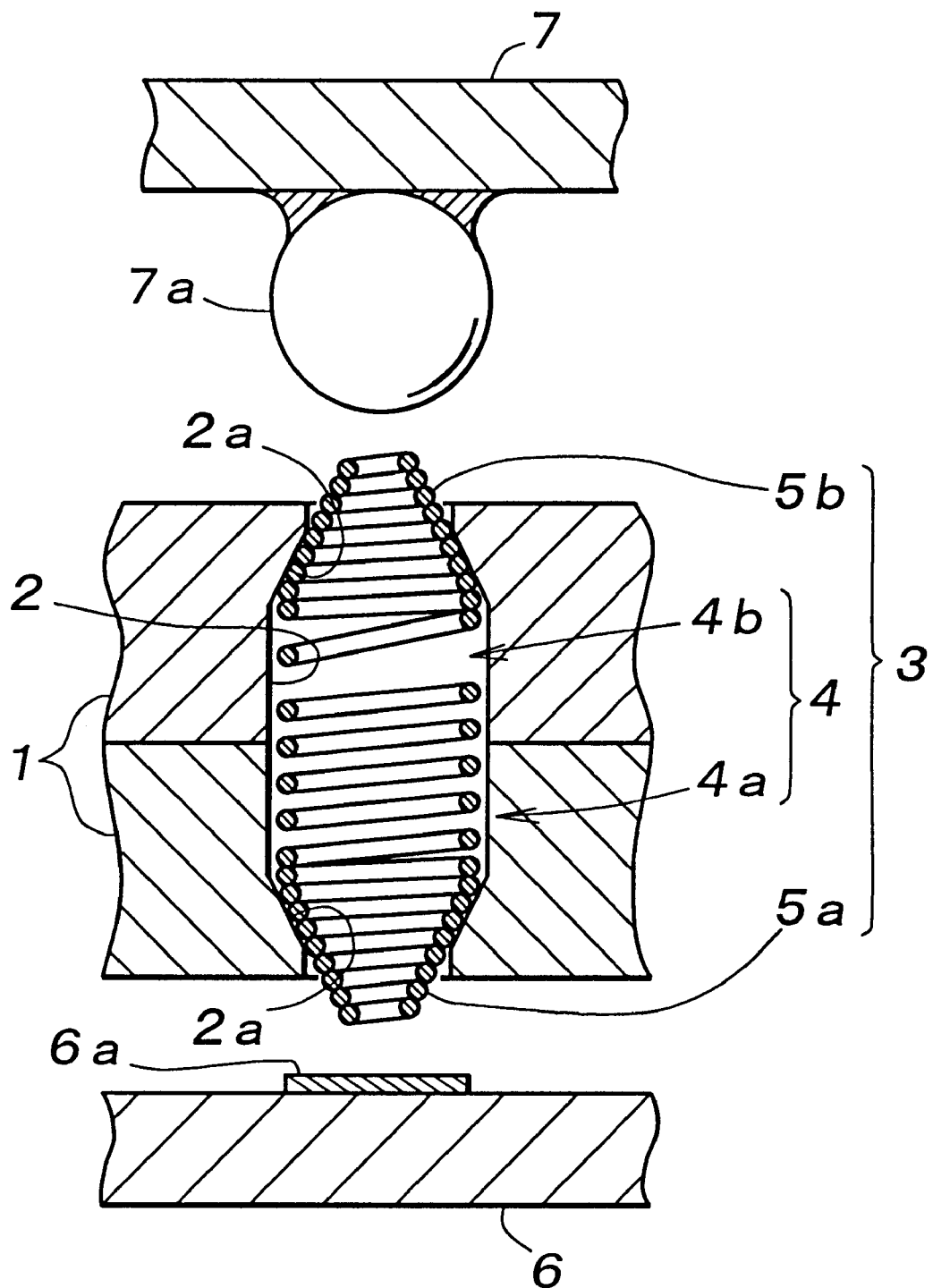
FIG. 1 is a schematic sectional view of a first embodiment of the electroconductive contact unit according to the present invention.

FIG. 1 is a sectional view of an essential part of the first embodiment of the electroconductive contact unit according to the present invention which is applied to a socket for a semiconductor device. This socket incorporates a large number of identical contact units which are arranged extremely close to each other, but in most part of the following description, only one of the contact units is described for the convenience of description. This socket comprises a pair of insulating plates 1 having a large number of axial bores 2 formed therein although only one of them is illustrated in the drawing. The axial bore 2 serving as a holder coaxially accommodates therein an electroconductive coil member 3 formed as a compression coil spring. The axial bore 2 includes a middle section having a uniform diameter, and outer tapered sections 2a. The inner diameter of each of the tapered sections 2a progressively diminishes toward the outer end thereof.

The coil member 3 includes a middle section formed as a compression coil spring section 4 having a uniform outer diameter which is slightly smaller than the inner diameter of the middle section of the axial bore 2, and a pair of tapered sections formed as contact pin sections 5b which are substantially complementary in shape to the tapered sections 2a of the axial bores 2. In the illustrated embodiment, the tapered sections or the contact pin sections 5a and 5b of the coil member 3 abut the associated complementary tapered sections 2a of the axial bore 2 under the spring force of the compression coil spring section 4 of the coil member 3. The contact pin sections 5a and 5b each consist of a closely wound coil wire, and serve as a contact electrode of the semiconductor socket.

The coil member 3 is longer in its free state than when it is received in the axial bore 2. Therefore, when assembling this semiconductor socket, the coil member 3 is received in the two halves of the axial bore 2 while keeping the two halves aligned with each other but spacing the insulating plates 1 away from each other by a suitable distance, and the two insulating plates 1 are then joined to each other by using suitable fastening means not shown in the drawings. Because the coil member 3 is tapered at both ends and the two halves of the axial bore 2 are similarly tapered, the coil member 3 can be received in the two halves of the axial bore 2 without any difficulty. Therefore, the assembling process can be significantly simplified as compared to the contact unit using needle-shaped coil members and a separate compression coil spring for biasing the coil members. Once the insulating plates 1 are firmly joined with each other, the coil member 3 is received in the axial bore 2 under a pre-stressed condition. The contact pin sections 5a and 5b of the coil member 3 generally abut the corresponding tapered sections 2a of the axial bore 2, but the free ends of the contact pin sections 5a and 5b project out of the axial bore 2 by prescribed lengths.

Because the projecting length of each end of the contact pin sections 5a and 5b of the coil member 3 is determined by the resilient abutting of the tapered contact pin sections 5a and 5b of the coil member 3 onto the corresponding tapered sections 2a of the axial bore 2, it is possible to minimize the fluctuation of the projecting length of the contact pin section from one coil member to another. Also, because of the pre-stress applied to the coil member 3, the spring load of the coil member 3 can be kept relatively constant without regard to the difference in the height of the object to be contacted or the difference in the amount of deflection of the coil member.

Figure 2:
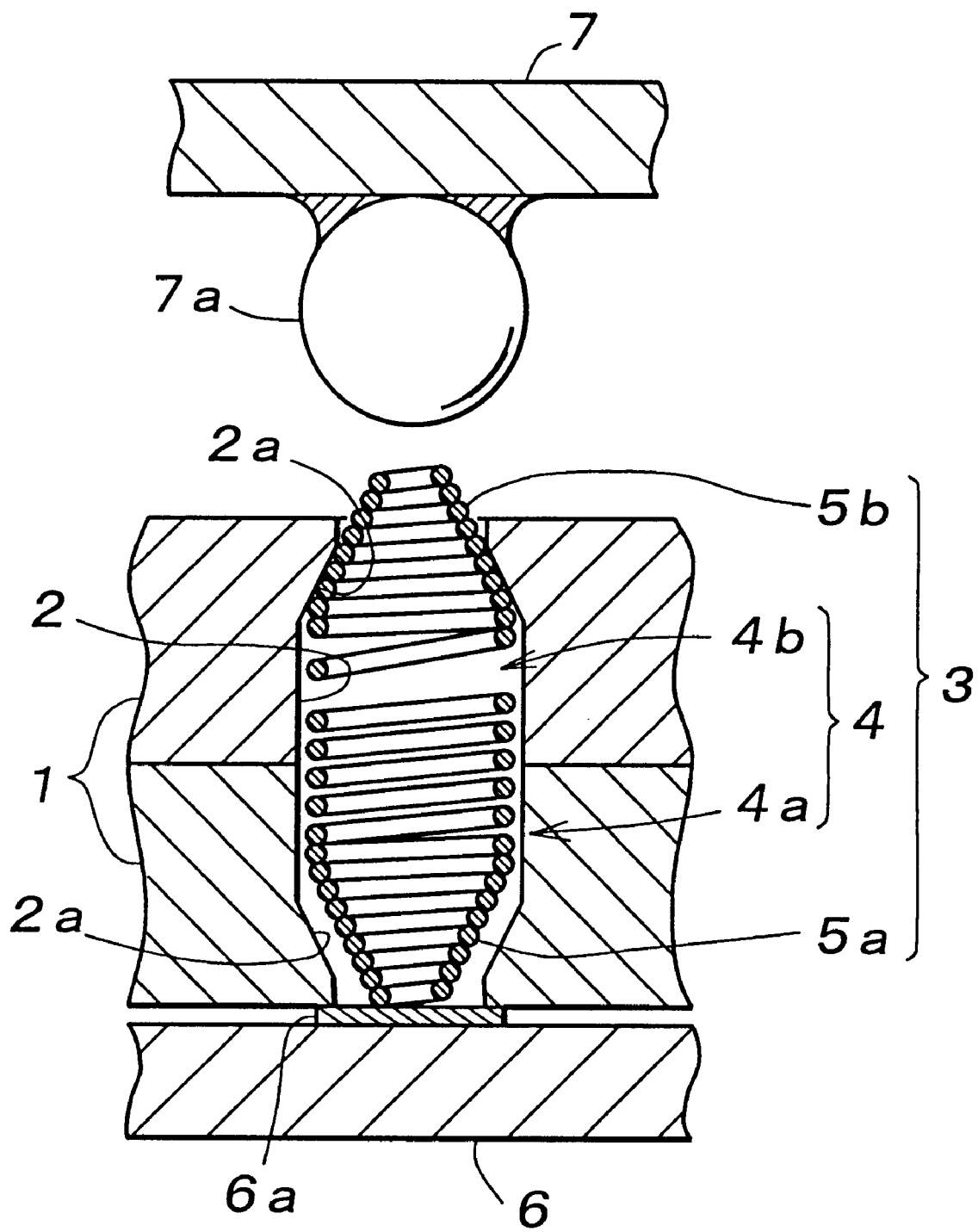
FIG. 2 is a view similar to FIG. 1 when the contact unit is applied to a circuit board.

When this socket is not in use, the two ends of the coil member 3 project out of the axial bore 2 by a prescribed distance. When this socket is in use, as illustrated in FIG. 2, the socket assembly is placed over a circuit board 6 so as to bring the associated contact pin section 5a into contact with a corresponding contact pad 6a which is connected to an internal conductor or a circuit not shown in the drawing. Additionally, a semiconductor device 7 formed as a BGA is placed on the other side of the socket assembly so as to bring the associated contact pin section 5b into contact with a corresponding solder ball 7a which is connected to an internal circuit of the semiconductor device 7. The socket and the semiconductor device are secured in this state by suitable clamping means which is not shown in the drawing.

Thus, according to the socket for semiconductor devices described above, the solder ball 7a and the contact pad 6a are electrically connected to each other solely via the coil member 3 so that a stable and low-resistance electric connection can be established between them. When an electric connection is thus established, the electric inductance H of the coil member 3 in the form of a compression coil spring can be given by the following equation:

$$H = A \cdot N^2 / L$$

where A is a constant coefficient, N is the number of turns of the coil wire, and L is the axial length of the coil member. Therefore, to reduce the electric inductance, it is desirable to minimize the number of turns of the coil member 3. On the other hand, for the coil member to have a desired resiliency and a required compression stroke as a compression coil spring, a certain number of turns is necessary.

In this embodiment, the coil spring section 4 of the coil member 3 comprises a normally wound segment 4a having a relatively small coil pitch and a coarsely wound segment 4b having a relatively large coil pitch. Therefore, assuming that the coil wire has a uniform thickness, as the coil member 3 is compressed, the gaps between the adjacent turns of the coil wire of the normally wound segment 4a are closed before those of the coarsely wound segment 4b do.

Figure 3:
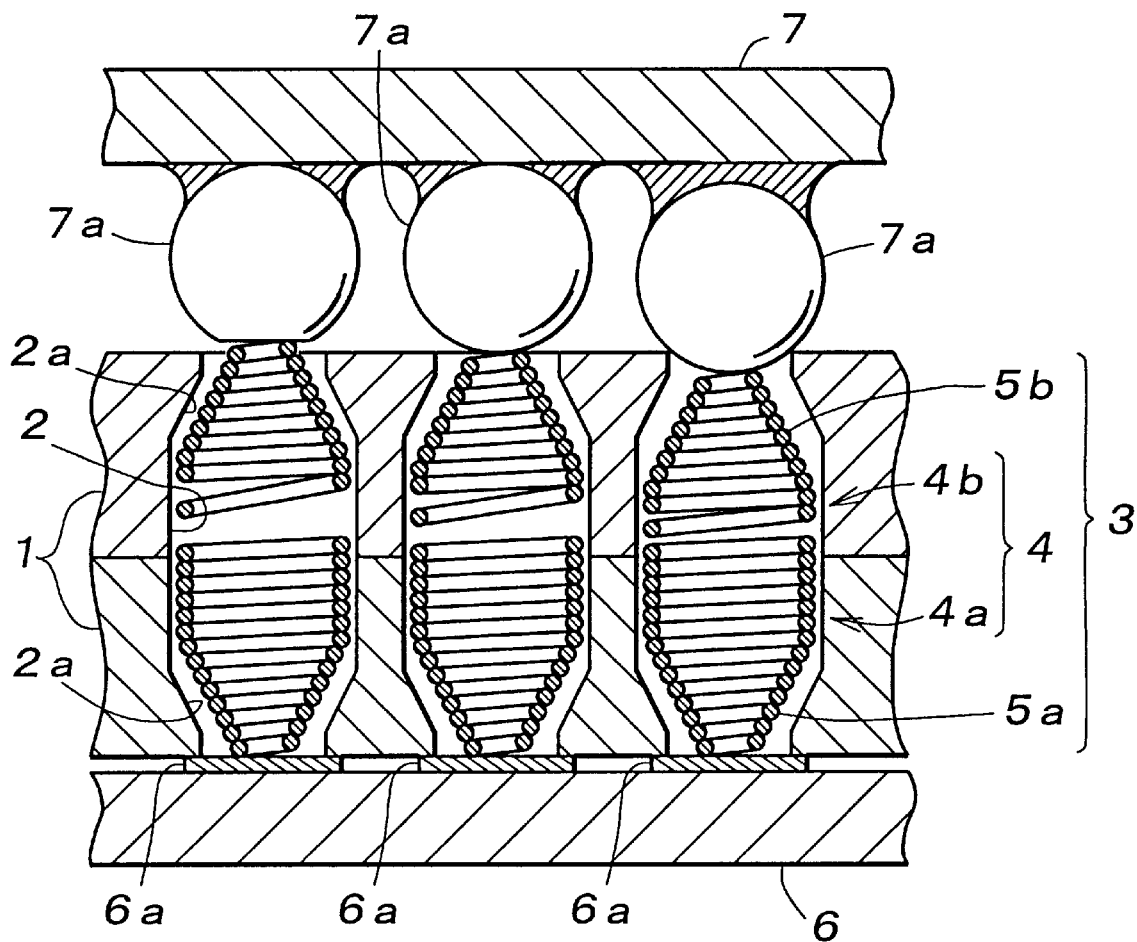
FIG. 3 is a view showing three contact units which are applied to solder balls of a semiconductor device package having different heights.

Therefore, when the coil member 3 is compressed to a certain extent, for instance when the socket is placed over a circuit board 6 as illustrated in FIG. 2, the adjacent turns of the coil wire of the normally wound segment 4a of the compression coil spring section 4 are substantially brought into contact with each other. When the semiconductor device 7 is mounted to the other side of the socket as illustrated in FIG. 3, the coarsely wound segment 4b of the compression coil spring section 4 is resiliently deflected. The deflection stroke of the coarsely wound segment 4b of the compression coil spring section 4 is selected in such a manner that the coil member 3 can accommodate the difference in the height of each solder ball 7a. In other words, the number of turns is selected to be no more than required for accommodating any difference in the height of the object to be contacted.

By thus minimizing the number of turns of the coarsely wound segment 4b of the coil member 3, it is possible to minimize the electric inductance of the coil member 3 because the coil member 3 provides an electric path which extends straight in the axial direction with the exception of the coarsely wound segment 4b. When the socket is in use, the adjacent turns of the coil wire of the normally wound segment 4a are in contact with each other. Also, the contact pin sections 5a and 5b each consist of a closely wound part of the coil member, and provides an axially straight electric path at all times.

Figure 4:
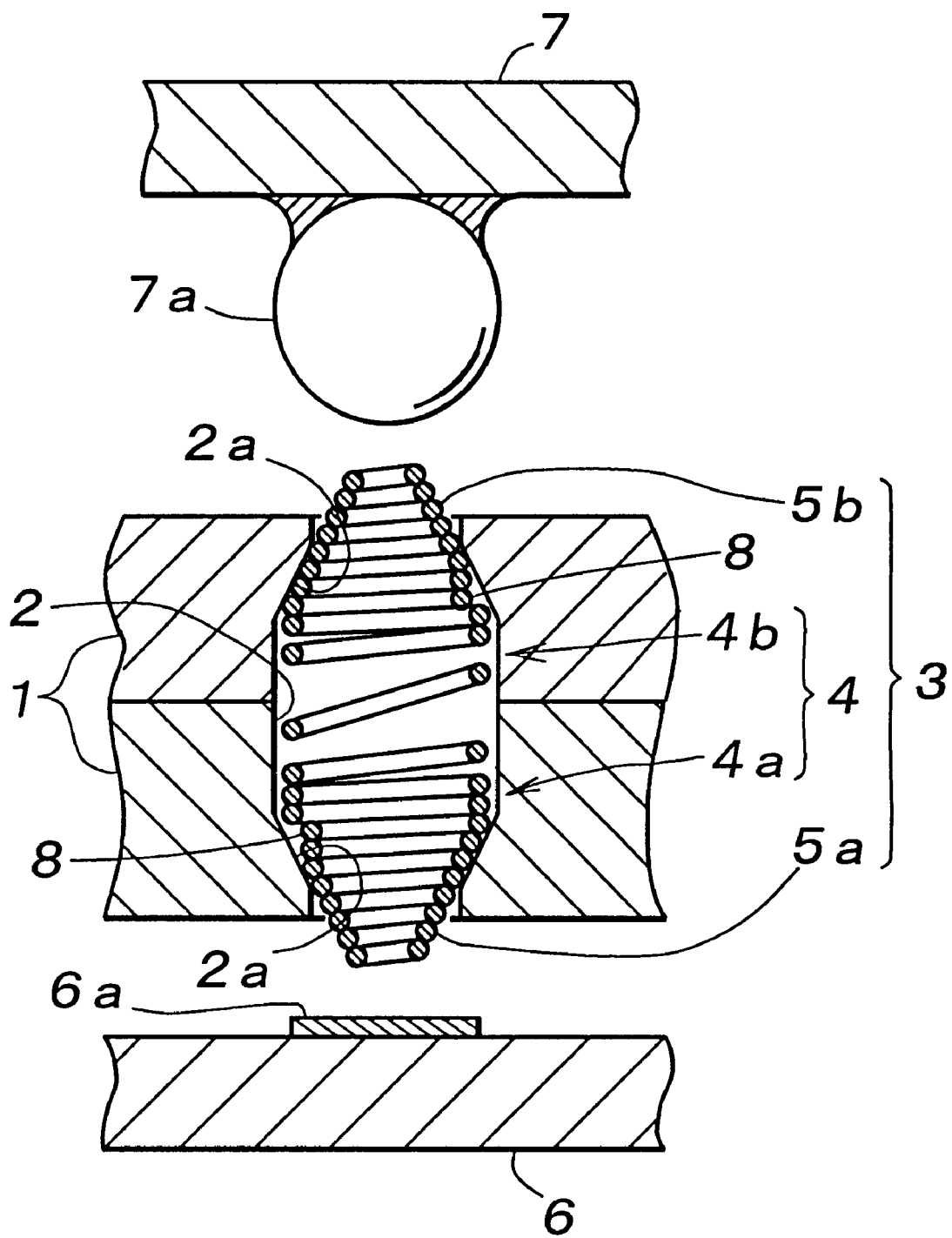
FIG. 4 is a view similar to FIG. 1 showing a second embodiment of the present invention.

FIG. 4 shows a second embodiment of the present invention. The parts corresponding to those of the previous embodiment are denoted with like numerals. The adjacent turns of the coil wire of the normally wound segment 4a are in contact with each other in the assembled state even before the socket is applied to the circuit board 6 or the semiconductor device 7. In this case, any further deflection of the coil member 3 can be achieved by the deflection of the coarsely wound segment 4b. However, when it is required to favorably accommodate the variations or fluctuations in the height of the object to be contacted or in the size of the contact pin sections 5a and 5b, a small diameter segment 8 may be provided in a part adjacent the boundary between the compression coil spring section 4 and at least one of the contact pin sections 5a and 5b so that an additional axial deflection of the coil member 3 may be accomplished by the coil wire of the small diameter segment 8 deflecting into the interior of the adjacent larger diameter segment.

Figure 5:
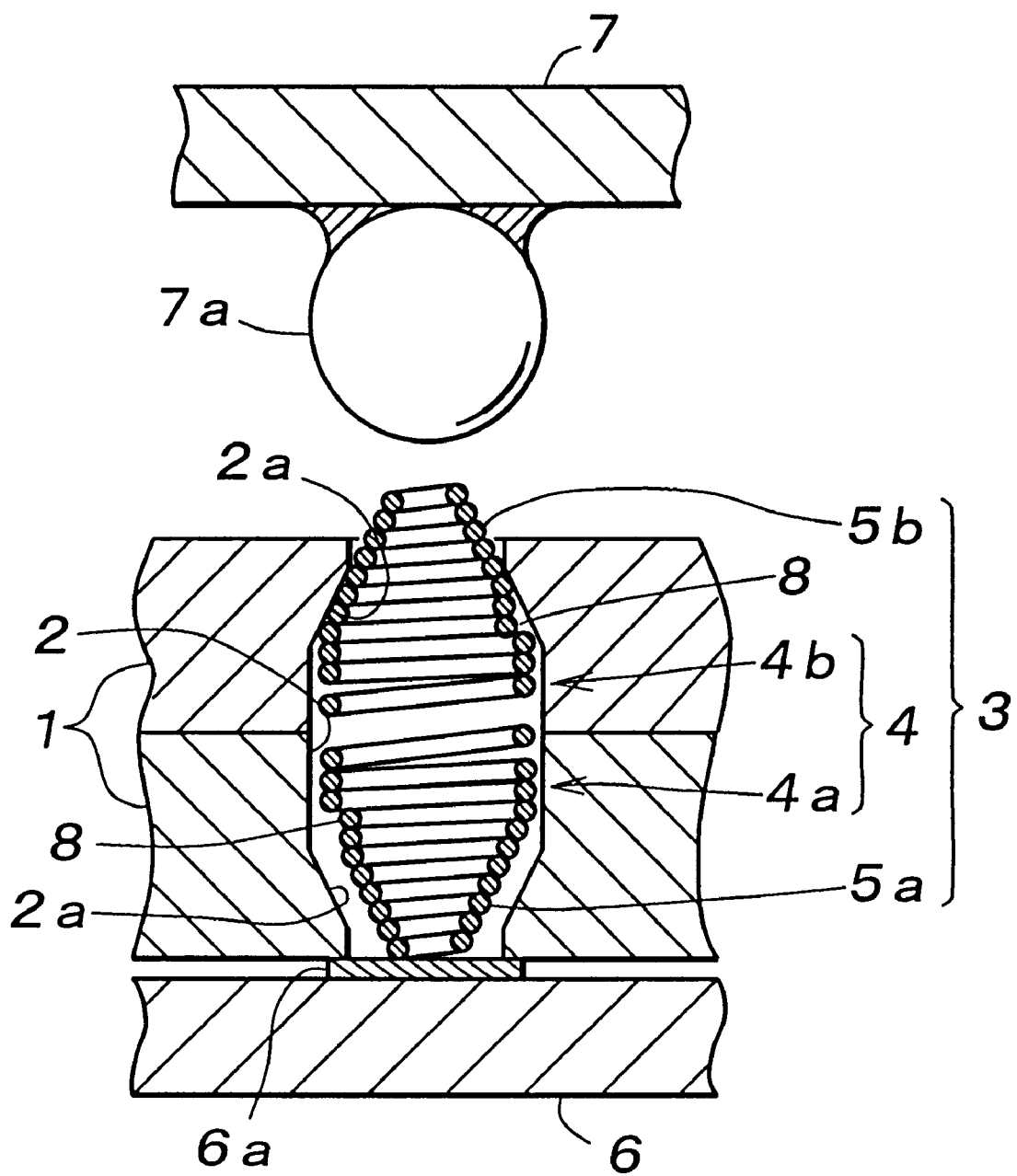
FIG. 5 is a view similar to FIG. 2 showing the contact unit of the second embodiment applied to a circuit board.
Figure 6:
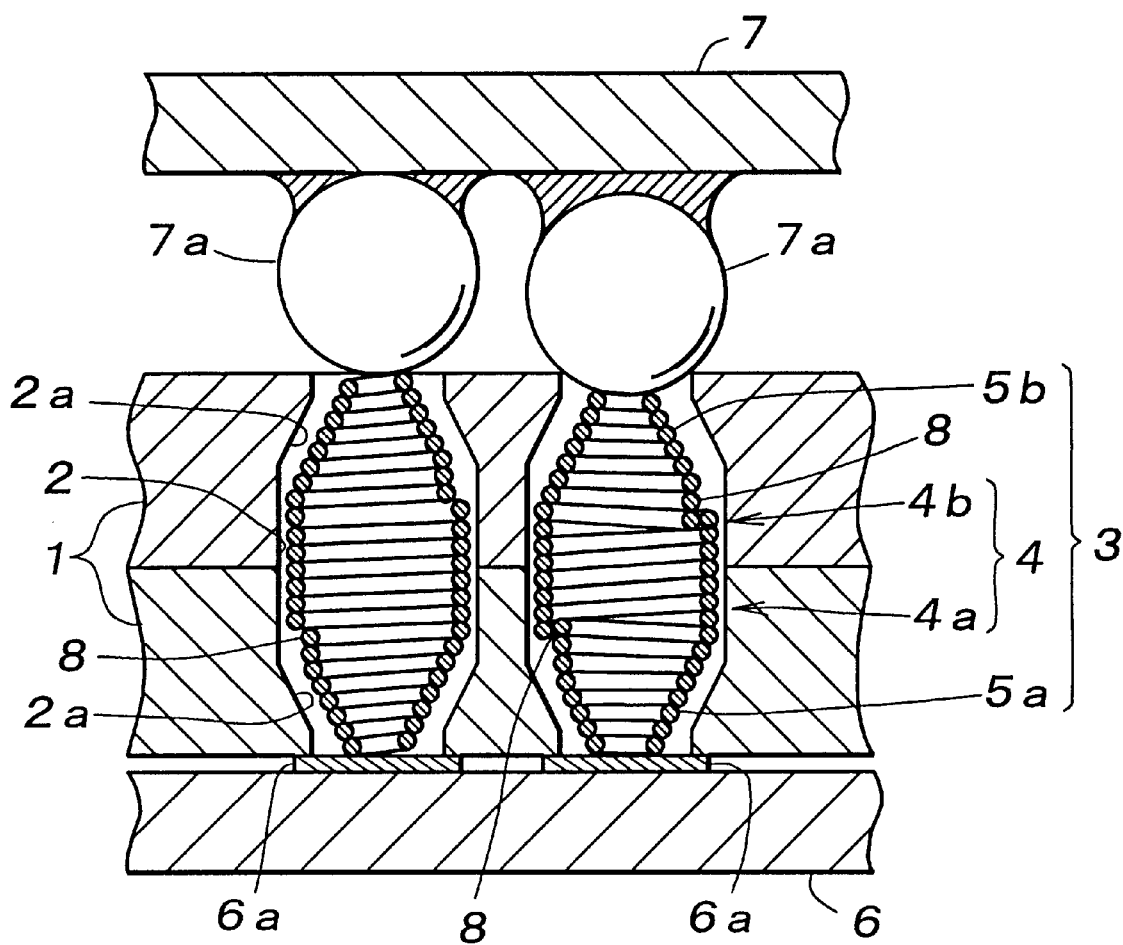
FIG. 6 is a view similar to FIG. 3 showing two contact units of the second embodiment.

FIG. 5 shows the socket of the second embodiment of the present invention when it is applied to a circuit board 6, and secured thereto by fastening means not shown in the drawing. FIG. 6 shows two of such contact units applied to two solder balls 7a of a semiconductor device 7 formed as a BGA which are different in height. The contact unit on the left hand side of the drawing is applied to the solder ball 7a having a standard height, and substantially all the turns of the coil wire of the coil member 3 are in contact with each other. Therefore, the coil member 3 is electrically equivalent to a tubular member, and will therefore be low in electric inductance and electric resistance. The contact unit on the right hand side of the drawing is applied to a solder ball 7a having a relatively large height. The contact unit is therefore required to deflect more than usual, and this additional deflection of the contact unit is accommodated by the coil wire of the small diameter segment 8 deflecting into the interior of the adjacent larger diameter segment.

Figure 7:
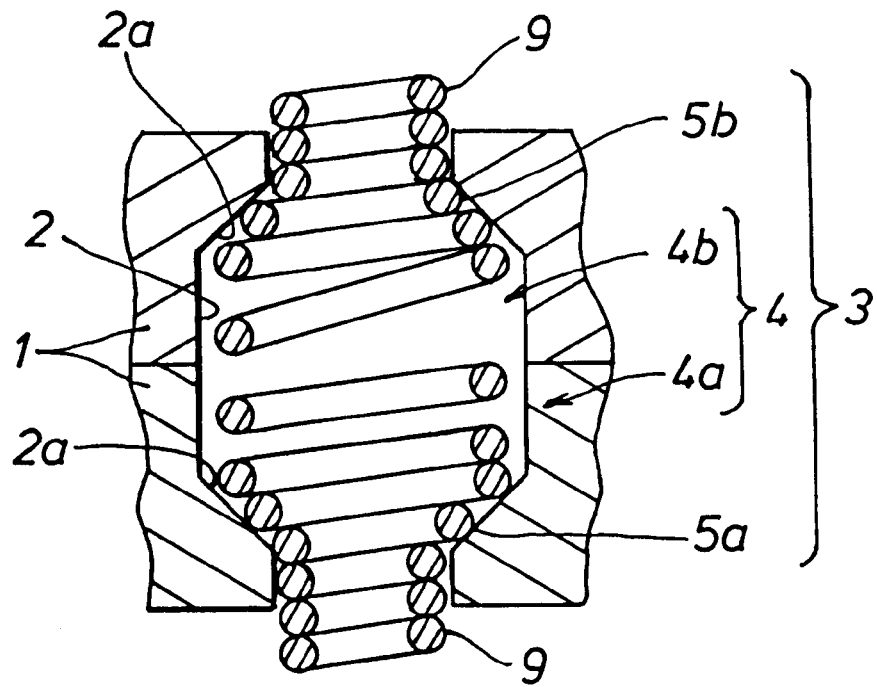
FIG. 7 is an enlarged sectional view showing a third embodiment of the present invention.

FIG. 7 shows a third embodiment of the present invention. According to this embodiment, each of the contact pin sections 5a and 5b is provided with a closely-wound, cylindrical segment 9 having a substantially uniform diameter. By so doing, it is possible to improve the positional precision of the contact pin sections 5a and 5b within the plane of the insulating plates.

Figure 8:
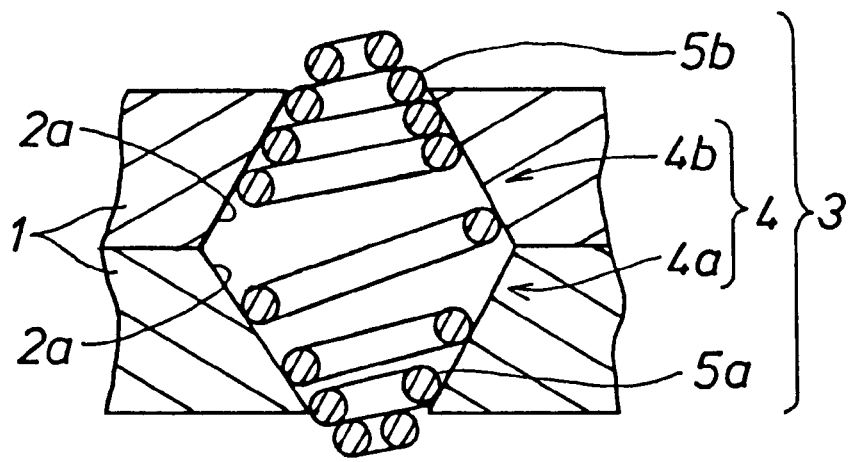
FIG. 8 is a view similar to FIG. 7 showing a fourth embodiment of the present invention.

FIG. 8 shows a fourth embodiment of the present invention in which the axial bore 2 which is passed through the two insulating plates 1 consists of two strictly tapered sections 2a, and does not include any straight cylindrical section. The two halves of the axial bore 2 are formed in the associated insulating plates 1 as strictly tapering holes. This embodiment simplifies the process of forming the axial bore 2.

Figure 9:
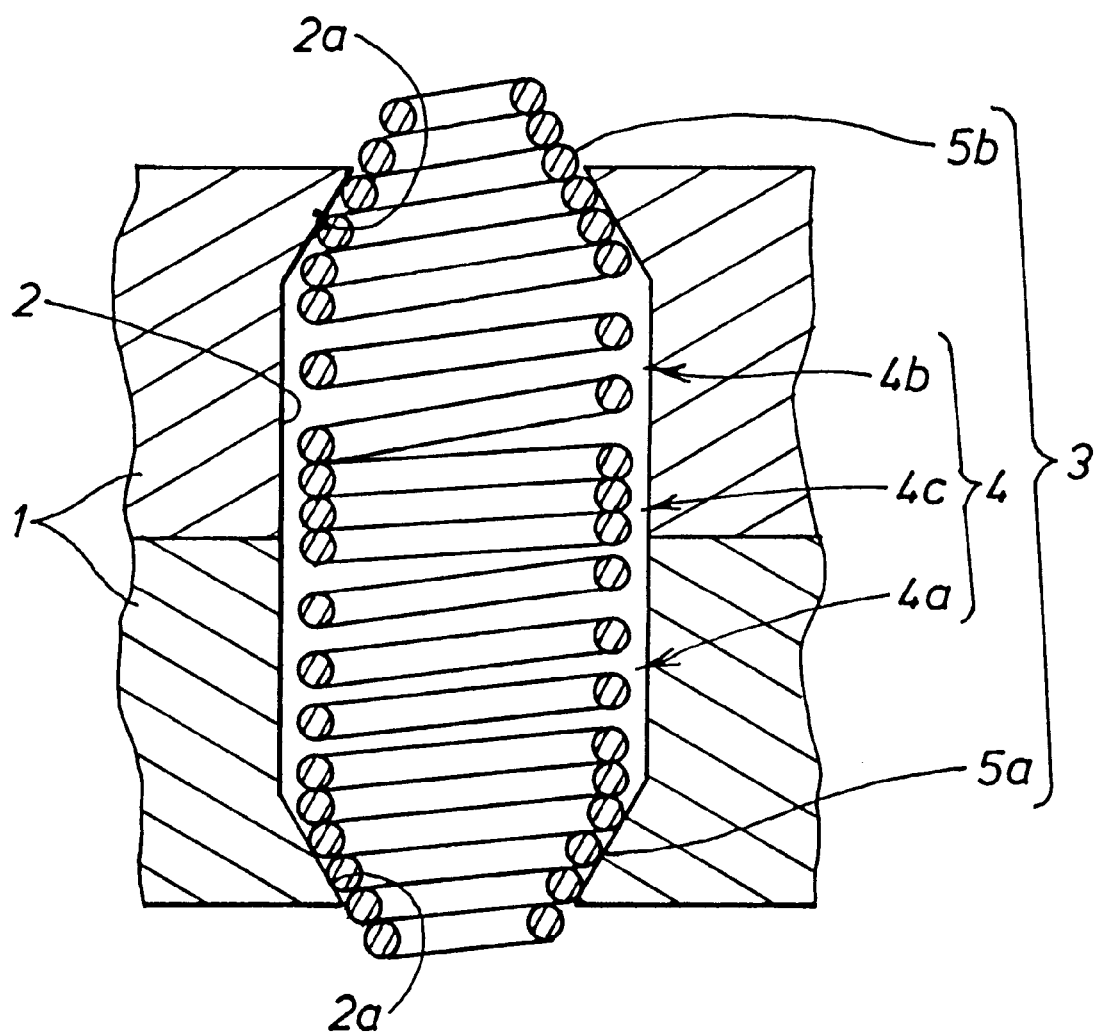
FIG. 9 is a sectional view showing a fifth embodiment of the present invention.

FIG. 9 shows a fifth embodiment of the present invention which is characterized by the configuration of the coil member 3. In this embodiment, the compression coil spring section 4 of the coil member 3 consists of a normally wound segment 4a, a coarsely wound segment 4b, and a closely wound segment 4c formed between the normally wound segment 4a and the coarsely wound segment 4b. In other words, the normally wound segment 4a and the coarsely wound segment 4b are separated from each other by the closely wound segment 4c.

According to this embodiment, the entangling of the coil members can be avoided. When assembling the socket or other devices using a large number of contact units, a large number of coil members are required to be fed or otherwise handled. During such a process, the coarsely wound segment of each coil member tends to cause entangling of coil members. By thus separating the normally wound segment 4a from the coarsely wound segment by a closely wound segment in each coil member, it is possible to avoid such entangling of coil members.

Although the present invention has been described in terms of preferred embodiments thereof, it is obvious to a person skilled in the art that various alterations and modifications are possible without departing from the scope of the present invention which is set forth in the appended claims.

What we claim is:

1. An electroconductive contact unit, comprising:

a holder defining an axial bore, said axial bore including at each axial end a small diameter section, wherein each small diameter section has a diameter less than the remainder of the axial bore; and an electroconductive coil member received in said axial bore, said coil member including a pair of contact coil sections and a compression coil spring section interposed between said contact coil sections;

wherein each contact coil section includes a closely wound segment and has a free end coil projecting beyond said holder, the free end coil being smaller in diameter than said small diameter section of said axial bore; and wherein said compression coil spring section includes a portion having a larger diameter than said small diameter section of said axial bore, a coarsely wound segment, and a normally wound segment.

2. An electroconductive contact unit according to claim 1, wherein adjacent wire coil turns of said coarsely wound segment are brought into contact with each other when both of said contact coil sections are brought into contact with objects to be contacted.

3. An electroconductive contact unit according to claim 1, wherein said closely wound segment is tapered toward the free end coil.

4. An electroconductive contact unit according to claim 1, wherein said free end coil has a substantially cylindrical shape.

5. An electroconductive contact unit according to claim 1, wherein said axial bore is defined by axially aligned holes formed in at least a pair of plates.

6. An electroconductive contact unit according to claim 5, wherein said axial bore includes a cylindrical middle section having a substantially uniform diameter, and a pair of tapered sections formed at either axial end of said middle section, and tapering off towards axial ends thereof.

7. An electroconductive contact unit according to claim 5, wherein said holes are continuously tapered and are aligned such that the large diameter ends of each hole are adjacent.

8. An electroconductive contact unit according to claim 1, wherein adjacent wire coil turns of said normally wound segment are brought into contact with each other when at least one of said contact coil sections is brought into contact with an object.

9. An electroconductive contact unit comprising:
a holder defining an axial bore, said axial bore including at each axial end a small diameter section, wherein each small diameter section has a diameter less than the remainder of the axial bore; and
an electroconductive coil member received in said axial bore, said coil member including a pair of contact coil sections and a compression coil spring section interposed between said contact coil sections;
wherein each contact coil section has a free end coil projecting beyond said holder, the free end coil being smaller in diameter than said small diameter section of said axial bore; and
wherein said compression coil spring section includes a portion having a larger diameter than said small diameter section of said axial bore, a coarsely wound segment, and a normally wound segment, and adjacent wire coil turns of said normally wound segment are brought into contact with each other when said coil member is assembled inside said axial bore.

10. The unit of claim 9, wherein said closely wound segment is tapered toward the free end coil.

11. The unit of claim 9, wherein the free end coil has a substantially cylindrical shape.

12. The unit of claim 9, wherein adjacent wire coil turns of said coarsely wound segment are brought into contact with each other when both of said contact coil sections are brought into contact with objects to be contacted.

13. The unit of claim 9, wherein said coil member further includes between at least one of said contact coil sections and said compression coil spring section a small diameter coil so that any excess deflection of said coil member is accommodated by the small diameter coil deflecting into an interior of an adjacent segment of said coil member.

14. The unit of claim 9, wherein said compression coil spring section includes a closely wound segment between said coarsely wound and said normally wound segments.

15. An electroconductive contact unit comprising:
a holder defining an axial bore, said axial bore including at each axial end a small diameter section, wherein each small diameter section has a diameter less than the remainder of the axial bore; and
an electroconductive coil member received in said axial bore, said coil member including a pair of contact coil sections and a compression coil spring section interposed between said contact coil sections;
wherein each contact coil section has a free end coil projecting beyond said holder, the free end coil being smaller in diameter than said small diameter section of said axial bore;
wherein said compression coil spring section includes a portion having a larger diameter than said small diameter section of said axial bore, a coarsely wound segment, and a normally wound segment; and
wherein said coil member further includes between at least one of said contact coil sections and said compression coil spring section a small diameter coil so that any excess deflection of said coil member is accommodated by the small diameter coil deflecting into an interior of an adjacent segment of said coil member.

16. The unit of claim 15, wherein said free end coil has a tapered shape.

17. The unit of claim 15, wherein said free end coil has a substantially cylindrical shape.

18. The unit of claim 15, wherein adjacent wire coil turns of said closely wound segments are brought into contact with each other when both of said contact coil sections are brought into contact with objects to be contacted.

19. The unit of claim 15, wherein said compression coil spring section includes a closely wound segment between said coarsely wound and said normally wound segments.

20. An electroconductive contact unit comprising:
a holder defining an axial bore, said axial bore including at each axial end a small diameter section, wherein each small diameter section has a diameter less than the remainder of the axial bore; and
an electroconductive coil member received in said axial bore, said coil member including a pair of contact coil sections and a compression coil spring section interposed between said contact coil sections;
wherein each contact coil section has a free end coil projecting beyond said holder, the free end coil being smaller in diameter than said small diameter section of said axial bore; and
wherein said compression coil spring section includes a portion having a larger diameter than said small diameter section of said axial bore, a coarsely wound segment, a normally wound segment, and a closely wound segment between said normally wound segment and said coarsely wound segment.

21. The unit of claim 20, wherein said coil member further includes between at least one of said contact coil sections and said compression coil spring section a small diameter coil so that any excess deflection of said coil member is accommodated by the small diameter coil deflecting into an interior of an adjacent segment of said coil member.

22. The unit of claim 20, wherein said free end coil has a tapered shape.

23. The unit of claim 20, wherein said free end coil has a substantially cylindrical shape.

24. The unit of claim 20, wherein adjacent wire coil turns of said coarsely wound segment are brought into contact with each other when both of said contact coil sections are brought into contact with objects to be contacted.

* * * * *

UNITED STATES PATENT AND TRADEMARK OFFICE
CERTIFICATE OF CORRECTION

PATENT NO. : 6,043,666
DATED : March 28, 2000
INVENTOR(S) : Kazama, Toshio

It is certified that error appears in the above-identified patent and that said Letters Patent is hereby corrected as shown below:

Title page,
"Assignee," change "Kanagawa-Jen" to -- Kanagawa-Ken --.

Column 1,
Line 18: change "FILD" to -- FIELD --.

Signed and Sealed this

Fourteenth Day of August, 2001

*Attest:*

*Attesting Officer*

NICHOLAS P. GODICI
*Acting Director of the United States Patent and Trademark Office*